United States Patent [19]
Ohta et al.

[11] Patent Number: 5,559,374
[45] Date of Patent: Sep. 24, 1996

[54] HYBRID INTEGRATED CIRCUIT

[75] Inventors: Susumu Ohta; Katsumi Ohkawa; Noriaki Sakamoto, all of Osaka, Japan

[73] Assignee: Sanyo Electric Co., Ltd., Osaka, Japan

[21] Appl. No.: 218,604

[22] Filed: Mar. 25, 1994

[30] Foreign Application Priority Data

| Mar. 25, 1993 | [JP] | Japan | 5-066741 |
| Mar. 31, 1993 | [JP] | Japan | 5-074215 |
| Mar. 31, 1993 | [JP] | Japan | 5-074217 |

[51] Int. Cl.[6] .................. H01L 23/48; H01L 23/34
[52] U.S. Cl. .................. 257/723; 257/724; 257/693; 257/694
[58] Field of Search .................. 257/723, 724, 257/693, 694

[56] References Cited

U.S. PATENT DOCUMENTS

| 3,105,922 | 10/1963 | Fukui et al. | 257/726 |
| 4,819,042 | 4/1989 | Kaufman | 257/693 |
| 4,920,405 | 4/1990 | Itoh et al. | 257/724 |
| 5,077,595 | 12/1991 | Fukunage | 257/723 |
| 5,130,784 | 7/1992 | Saeki et al. | 257/723 |

FOREIGN PATENT DOCUMENTS

| 2819327 | 12/1979 | Germany | 257/723 |
| 57-15453 | 1/1982 | Japan | 257/725 |
| 62-133740 | 6/1987 | Japan . | |
| 2-130954 | 5/1990 | Japan | 257/724 |
| 3-178156 | 8/1991 | Japan . | |

*Primary Examiner*—Sara W. Crane
*Assistant Examiner*—Jhihan Clark
*Attorney, Agent, or Firm*—Thomas R. Morrison; Christopher R. Pastel

[57] ABSTRACT

A hybrid integrated circuit includes a plurality of metal plates supporting circuit elements and connectable directly to external power/output lines. The direct connection eliminates the need for solder terminals, allowing for reduced size and cost with increased reliability and lifespan. The metal plates can be position to allow for further minimization of the device, and uniform connection of internal wiring to the circuit elements.

5 Claims, 9 Drawing Sheets

HYBRID INTEGRATED CIRCUIT

BACKGROUND OF THE INVENTION

The present invention relates to hybrid integrated circuits, and more particularly, to high-current hybrid circuits which support power circuits on metallic substrates.

Hybrid integrated circuits (HICs) which employ ceramic substrates are widely known. However, poor heat conductance of the ceramic substrate, and high sheet resistance of the circuit patterns due to attachment with noble metal paste, make them impractical for use with high-current power circuits due to current loss and waste heat.

HICs which utilize a metallic substrate and a copper film pattern separated by an insulating resin layer are disclosed in Japanese Laid Open Publications Nos. 63-302530, 64-25554, and 64-5092. The copper film pattern has the dual role of supporting the power circuit elements and acting as a heat sink. The copper film pattern also has a plurality of terminals on the substrate soldered at prescribed positions for connection to various voltage sources and/or output lines.

The use of soldered terminals in this manner carries numerous disadvantages. First, the dedication of specific portions of the substrate to act as soldering points requires an excessive amount of space, compromising cost and spacial optimization. Second, solder oxidation deteriorates the solder layer connection to the; output current path, shortening the lifespan of the device. Third, the solder layer has a high electrical resistance, prompting current loss and producing waste heat. Thus, use of the soldered terminals in the devices of the prior art fails to adequately address the problem of supporting power circuits on metallic substrates.

A typical invertor circuit used in conjunction with prior art HICs is shown in FIG. 1. On a conventional HIC, the length of the wires connecting the electrodes of switching elements leads to high wire resistance and inductance when carrying high currents. Although external wire inductance caused by connecting an AC to DC conversion capacitor C1 can be reduced by an external snubber capacitor C2, internal inductance remains uncompensated. The resultant switching noise and voltage spikes interfere with the operation of the switching elements, producing less reliable results. For example, if switching elements SW1 and SW5 are ON, the resultant current path experiences uncompensated inductances $L_{U1}$, $L_{U2}$, $L_{V2}$.

Similar difficulties occur in the prior-art inverter circuit shown in FIG. 8, in which each switching element consists of a plurality of high-power elements (output current loads exceeding 100 A) connected in parallel. This design unavoidably requires additional wire, causing additional inductance difficulties. These difficulties are compounded by the fact that wires of different length provide different currents to the parallel switching elements. Switching elements with short wire patterns experience higher currents than standard tolerance, that can damage the element.

OBJECTS AND SUMMARY OF THE INVENTION

It is an object of the present invention is to provide a hybrid integrated circuit which overcomes the drawbacks of the prior art.

It is a further object of the invention to provide a hybrid integrated circuit in which external circuits are connected directly to metal plates which support switching elements.

The direct connection removes the need for solder terminals on the substrate surface, reducing cost, optimizing space, and eliminating the difficulties caused by current loss and solder oxidation.

It is a still further object of the invention to provide a hybrid integrated circuit in which the metal plates interconnect switching elements using a minimum amount of wire of uniform length. The orientation of the plates in this manner minimizes internal wire resistance and inductance, and balances the current to all switching elements.

It is a still further object of the invention to incorporate snubber capacitors directly into the circuit to offset internal inductance.

Briefly stated, a series of conductive paths are mounted on a metallic substrate. First, second and third copper plates are mounted on desired portions of the conductive paths. A plurality of high-side switching elements are mounted on the first copper plate, while a plurality of low-side switching elements are connected to the third copper plate. The various switching elements and copper plates are then connected to each other to form the circuit shown in FIG. 1. The circuit is encased in a fiberglass shell and covered with a silicon gel and epoxy resin.

Each of the first, second and third copper plates has a protrusion, substantially perpendicular to its corresponding copper plate, which extends beyond the top surface of the completed circuit. These protrusions can be directly connected to external power or output lines, thereby eliminating the need for a dedicated solder terminal point on the substrate surface.

According to a second embodiment of the invention, the second copper plate is located above, and partially overlapping, the third copper plate. This allows for the application of minimum wire of uniform length to connect the switching elements, reducing wire inductance. In addition, a portion of the second copper plate and first copper plate extend beyond the side of the completed device, allowing for direct connection to external power/output lines without direct connection to the substrate. The disposition of the second copper plate out of the plane defined by the first and third copper plates allows for further reduction in the size of the circuit.

The third embodiment of the invention is used when the switching elements consist of a plurality of parallel elements mounted on first and third copper plates. A portion of the third copper plate is bent to overlap the first copper plate, while the second copper plate is suspended above the third copper plate. Both the second copper plate and the overlapping portion of the third copper plate contain control patterns, which connect to various electrodes of the switching elements using uniform lengths of wire. These control patterns are in turn connected to a control substrate which supports external drive circuits. Snubber capacitors are disposed between the first and second copper plates to offset self-inductance in the copper plates.

According to an embodiment of the invention, there is provided a hybrid integrated circuit comprising a substrate, a metal plate disposed on said substrate, at least one circuit element disposed on said metal plate, means for connecting said at least one circuit element and said metal plate to other internal components in a predetermined pattern, means for encasing said substrate, said metal plate, said at least one circuit element, and said means for connecting, said metal plate including a protrusion which extends beyond said means for encasing, and said protrusion including means for permitting connection of said protrusion to external circuits.

According to further embodiment of the invention, these is provided a hybrid integrated circuit comprising a metallic substrate, first, second and third metal plates, said first and second metal plates being mounted on said metallic substrate, and including means for mounting at least one switching element thereon, respectively, means for connecting said at least one switching element and said first, second and third metal plates in a predetermined manner, means for encasing said metallic substrate, said at least one switching element, said first, second and third metal plates, and said means for connecting, said first, second and third metal plates including first, second and third protrusions, respectively, said first, second and third protrusions extending beyond said means for encasing, and each of said first, second and third protrusions including means for permitting connection of its respective protrusion to external circuits.

According to a still further embodiment of the invention, there is provided a hybrid integrated circuit, comprising a metallic substrate, first, second and third metal plates, said first metal plate and at least a portion of said third metal plate being mounted on said metallic substrate and defining a plane, a high-side switching element disposed on said first metal plate, a low-side switching element disposed on said portion of said third metal plate, means for connecting said high-side switching element, said low-side switching element, and said first, second and third metal plates in a predetermined pattern, means for encasing said metallic substrate, said high-side switching element, said low-side switching element, said first, second and third metal plates, and said means for connecting, said first and second metal plates including first and second protrusions, respectively, which extend beyond a periphery of said means for encasing, said third metal plate including a third protrusion substantially perpendicular to said plane and extending beyond a top surface of said means for encasing, and each of said first, second and third protrusions including means for permitting connection the respective protrusion to external circuits.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 6b is a side view of the outer periphery of the hybrid integrated circuit of FIGS. 5 and 6a.

DETAILED DESCRIPTION OF THE PREFERRED EMBODIMENT

Figure 2:
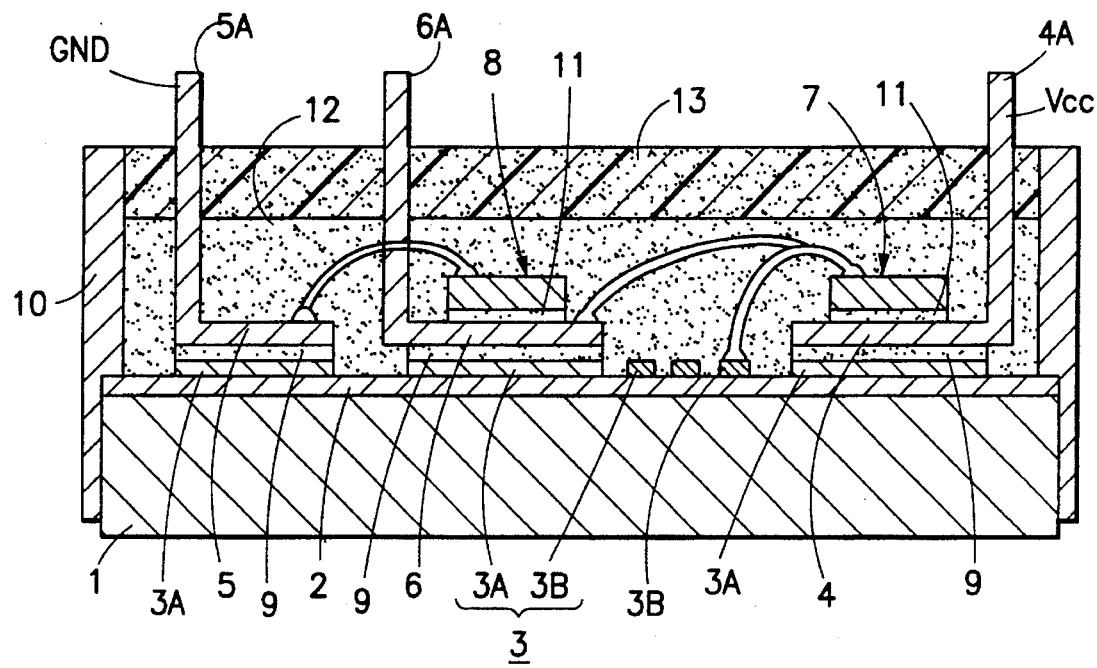
FIG. 2 is a cross-sectional view of a hybrid integrated circuit according a preferred embodiment of the invention.
Figure 3:
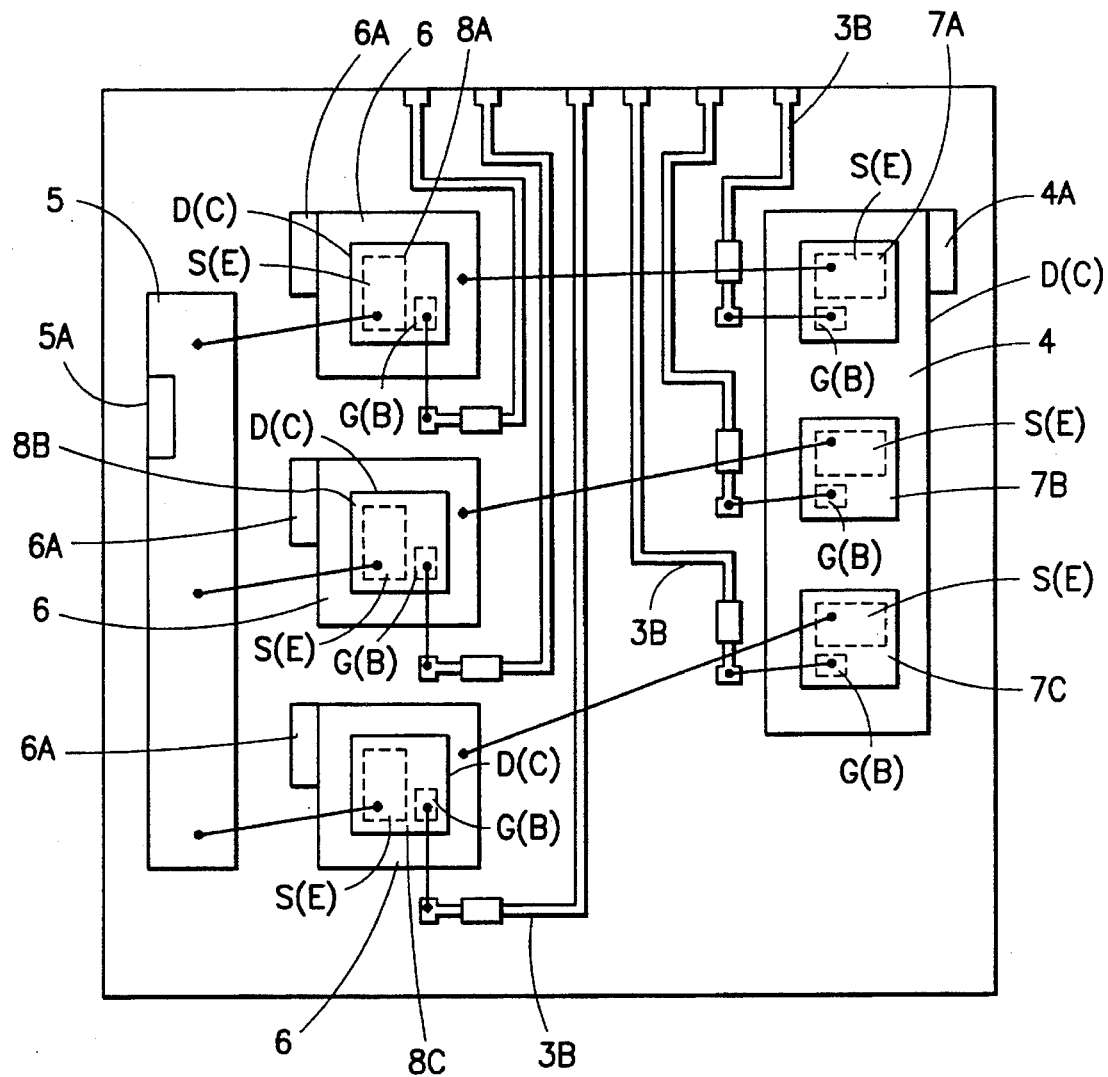
FIG. 3 is a plan view of the hybrid integrated circuit of FIG. 2.
Figure 4:
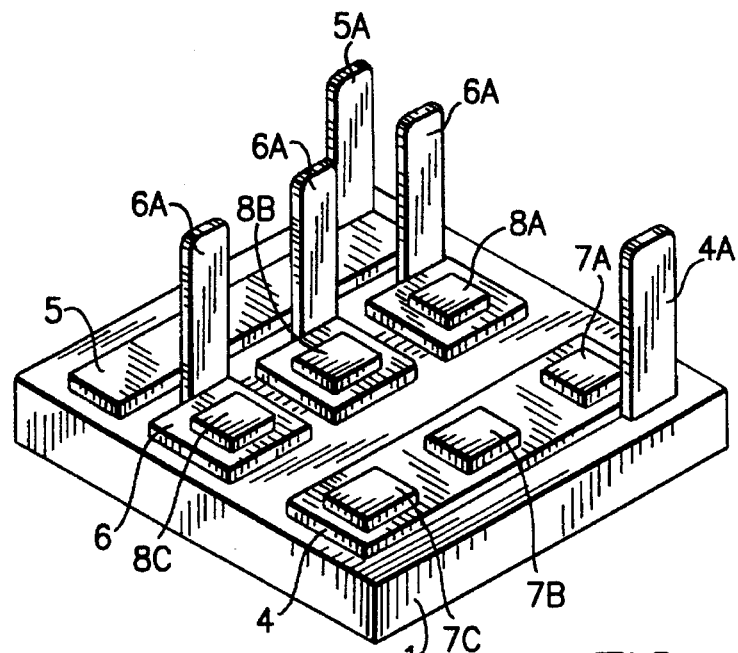
FIG. 4 is a perspective view of the hybrid integrated circuit of FIGS. 2 and 3.

Referring now to FIGS. 2–4, a metallic substrate 1, formed from aluminum or copper, has a rectangular shape 2–5 mm thick. If aluminum is used, substrate 1 can be coated with a thin aluminum oxide membrane to protect the surface. If copper is used, the surface can be protected with nickel or chrome plating. Substrate 1 can be made as part of a plurality of similar devices on a large sheet. Either before or after formation of the circuits thereon, the plurality of substrates 1 can be separated into individual substrates 1 by cutting or punching.

A clad material, including a copper membrane 35–105 micrometers thick and an adhesive thermosetting insulating resin (epoxy or polyamide), is hot-pressed onto the top surface of substrate 1 at a pressure of 50–100 kG/cm$^2$ at a temperature of 150–180° C. The process converts the insulating resin into an insulating layer 2. Subsequent photo-etching to the copper membrane forms conductor paths 3.

Conductor paths 3 each consists of a thick conductor path 3A and a plurality of thin conductor paths 3B. Thick conductor path 3A is screen printed with solder paste, to which first, second and third copper plates 4–6 are mounted. The solder reflow process converts the solder paste into solder layer 9, thereby fixing the copper plates. Each copper plate 4–6 has a thickness of 1–5 mm to handle high currents of 50–300 A.

Each of first, second and third copper plates 4–6 have first, second, and third protrusions 4A, 5A and 6A, respectively. Each protrusion is substantially perpendicular to its respective copper plate, and of sufficient length to extend beyond the surface of the device when later sealed. First protrusion 4A connects to a first power line, e.g., Vcc (not shown), second protrusion 5A connects to a second power line, e.g., ground (not shown), and third protrusion 6A connects to an output line for supplying current (not shown).

High-side switching elements 7A, 7B and 7C of the inverter circuit are fixed by solder layer 11 onto first copper plate 4, which places them in common contact with the first power line by first protrusion 4a. Similarly, low-side switching elements 8A, 8B and 8C are fixed onto third copper plate 6. Switching elements 7A, 7B and 7C and 8A, 8B, and 8C may be any high current elements, such as power bipolar transistors, power MOSFETs, or IGBTs. As shown in FIG. 3, if a MOS transistor is used, the alignment of the gate, source, and drain are indicated by G, S, and D, respectively. Similarly, if a bipolar transistor is used, then the emitter, base and collector are labeled E, B, and C, respectively. An IGBT has a gate, collector and emitter which corresponds to the base, collector and emitter of a bipolar transistor.

Figure 1:
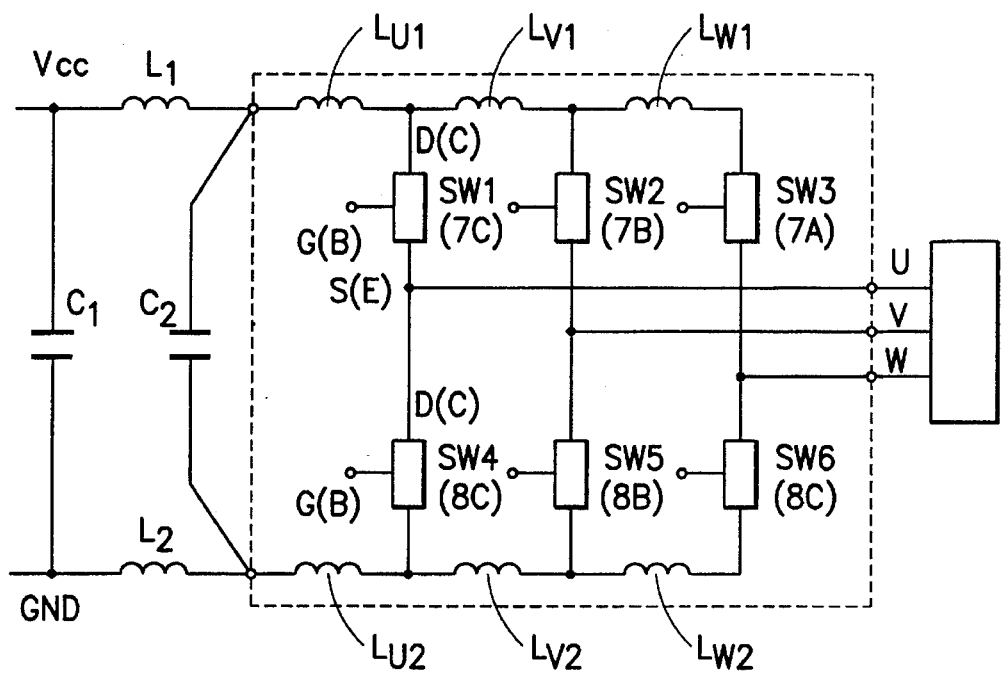
FIG. 1 is a schematic of an inverter circuit of the prior art, in which a hybrid integrated circuit, according to an embodiment of the present invention, may be used.

In order to form the circuit of FIG. 1, switching elements 7A, 7B and 7C and 8A, 8B, and 8C are linked as follows. The gate/base of switching elements 7A, 7B and 7C are wired to thin conductor path 3B, while the source/emitters are wired to third copper plate 6. The gate/base portions of switching elements 8A, 8B, and 8C are connected to thin conductor path 3B, while the source/emitters are wired to second copper plate 5.

The resultant circuit is encased about its periphery with a case 10 by injection molding of fiberglass or reinforced PET (FRPET) in a grid like pattern, and fixed flush to substrate 1 with an epoxy or silicon resin adhesive. A silicon gel 12 and epoxy resin 13 are sequentially added to fill the area surrounded by case 10 to protect the underlying elements.

In the preferred embodiment of the invention, switching elements 7A, 7B and 7C are mounted on a single first copper plate 4, while switching elements 8A, 8B, and 8C are mounted on a different third copper plate 6 for each element. However, if substrate 1 is made from aluminum, the differing coefficients of thermal expansion for aluminum and copper require an independent copper plate 4 for each switching element 7A, 7B and 7C.

Since protrusions 4A, 5A and 6A extend beyond the surface of epoxy resin 13, they can be connected directly to power supply and/or output path lines without either a dedicated terminal on the substrate surface, or a solder connection. The present invention can therefore be manufactured smaller and cheaper than the prior art, while the reduced current loss and heat generation provides improved reliability and a longer lifespan.

Figure 5:
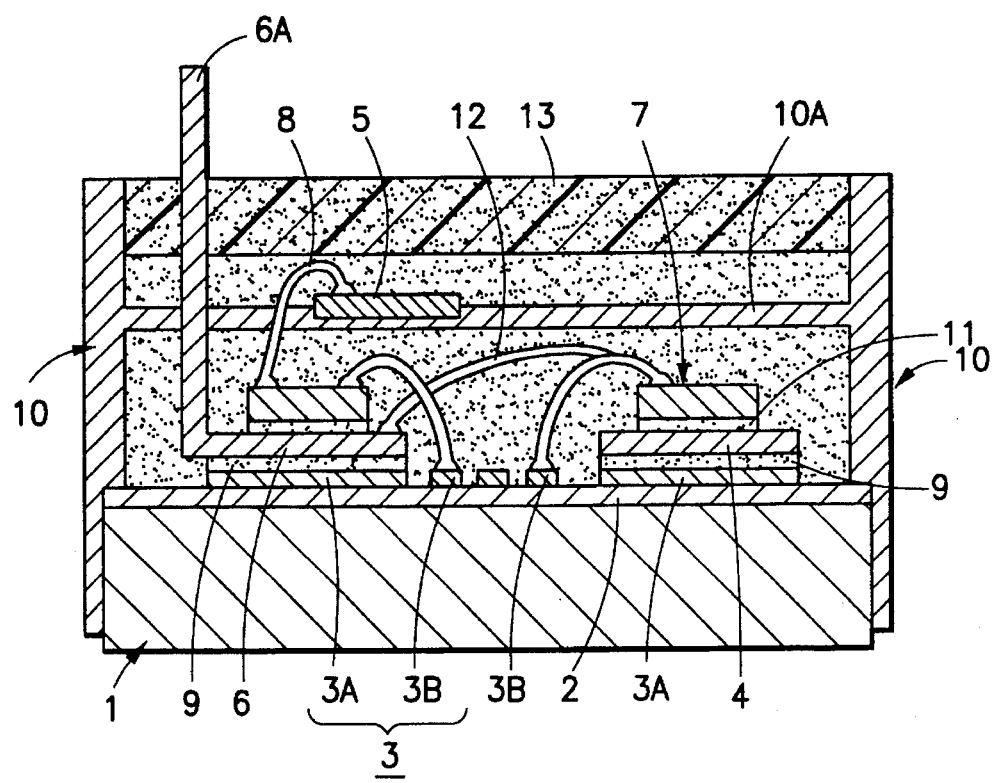
FIG. 5 is a cross-sectional view of a hybrid integrated circuit according to a second embodiment of the invention.
Figure 6A:
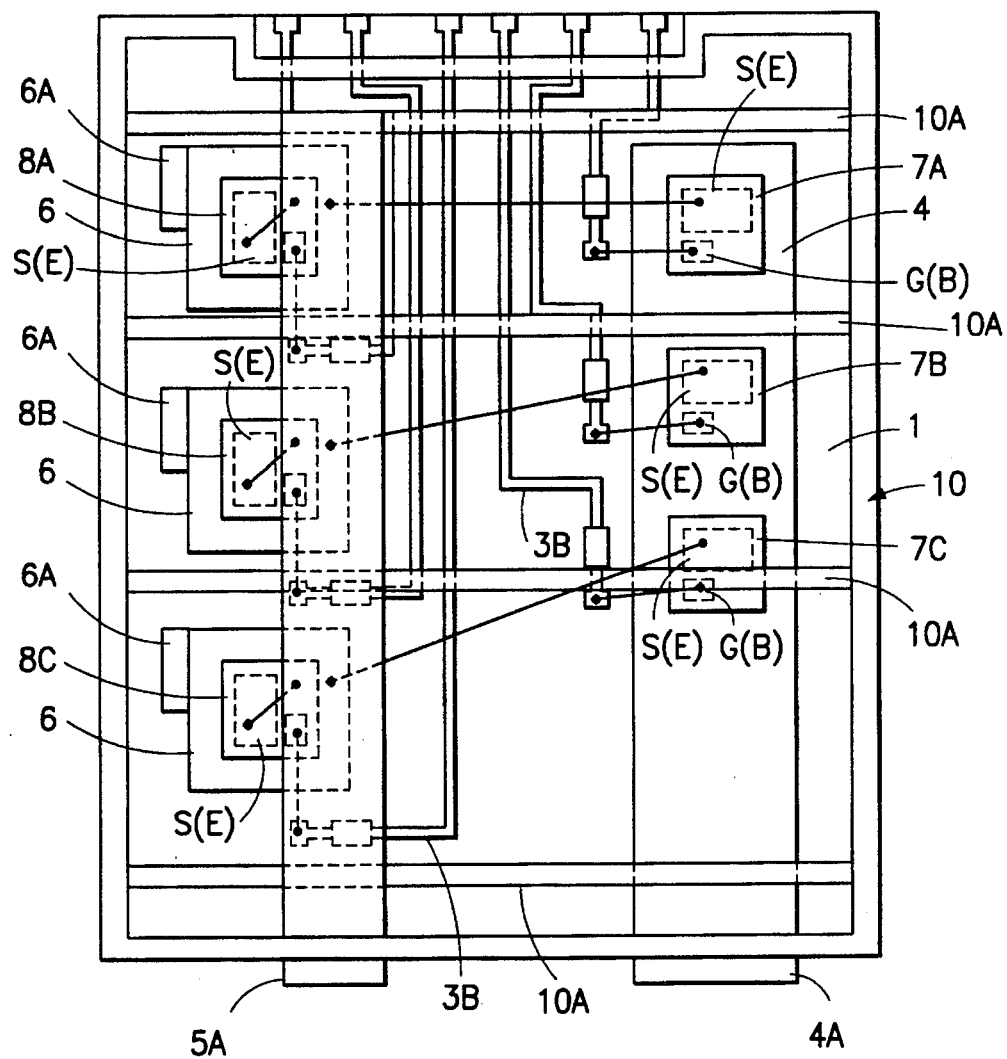
FIG. 6a is a plan view of the hybrid integrated circuit of FIG. 5.
Figure 6B:
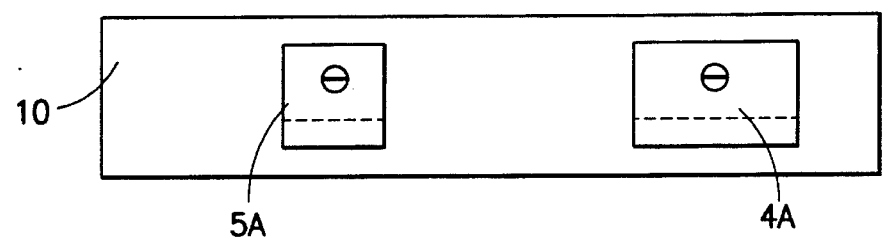
Figure 6C:
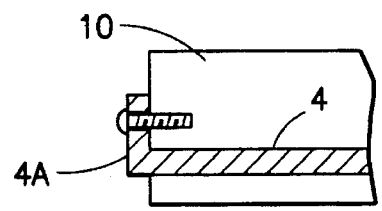
FIG. 6c is a cross-sectional view of the connection of a protrusion to the circuit.
Figure 7:
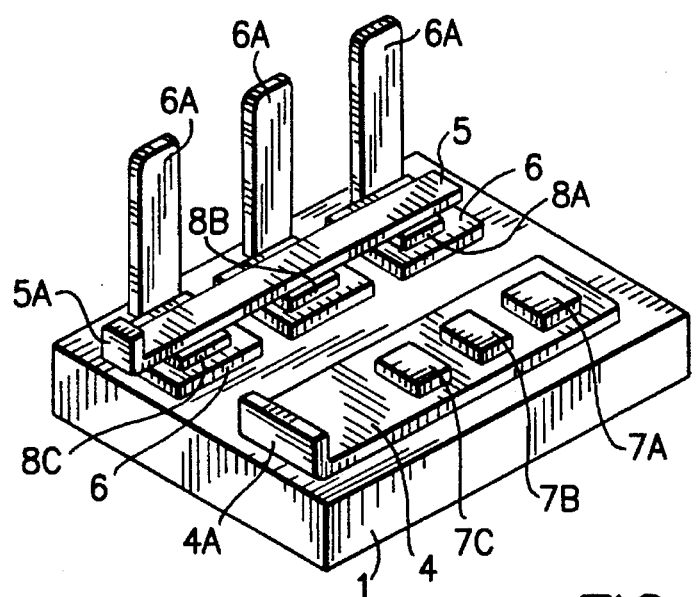
FIG. 7 is a perspective view of the second embodiment of the invention.
Figure 9:
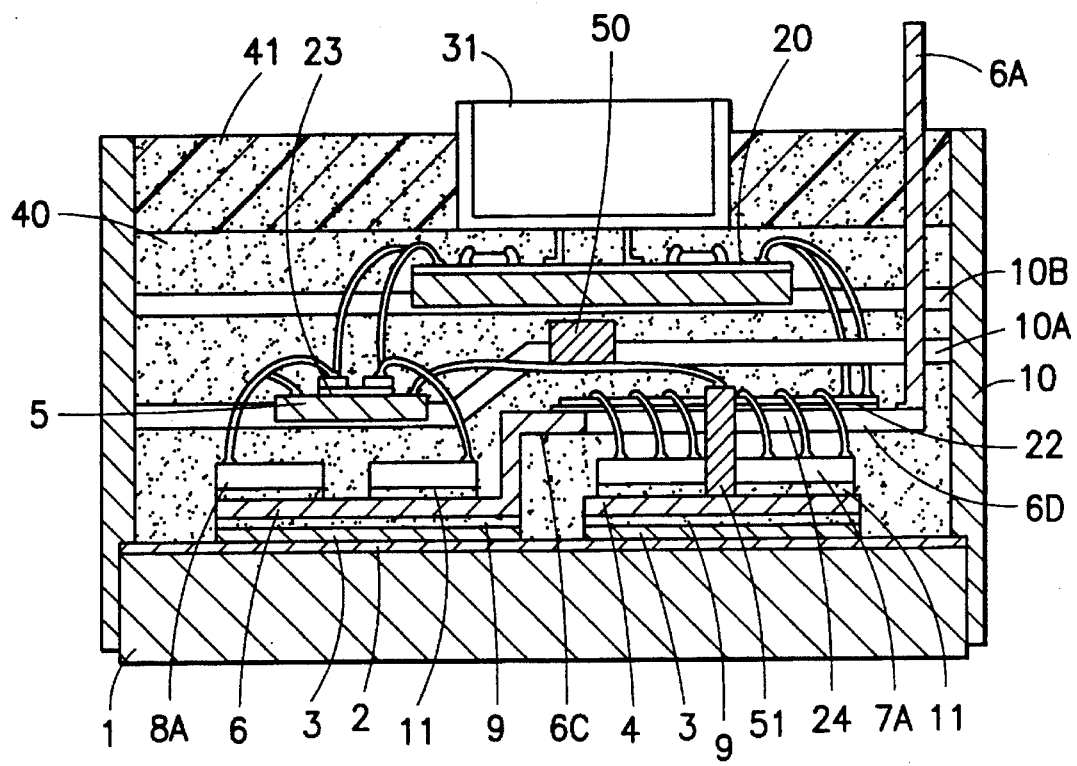
FIG. 9 is a cross-sectional view of a third embodiment of the invention.
Figure 8:
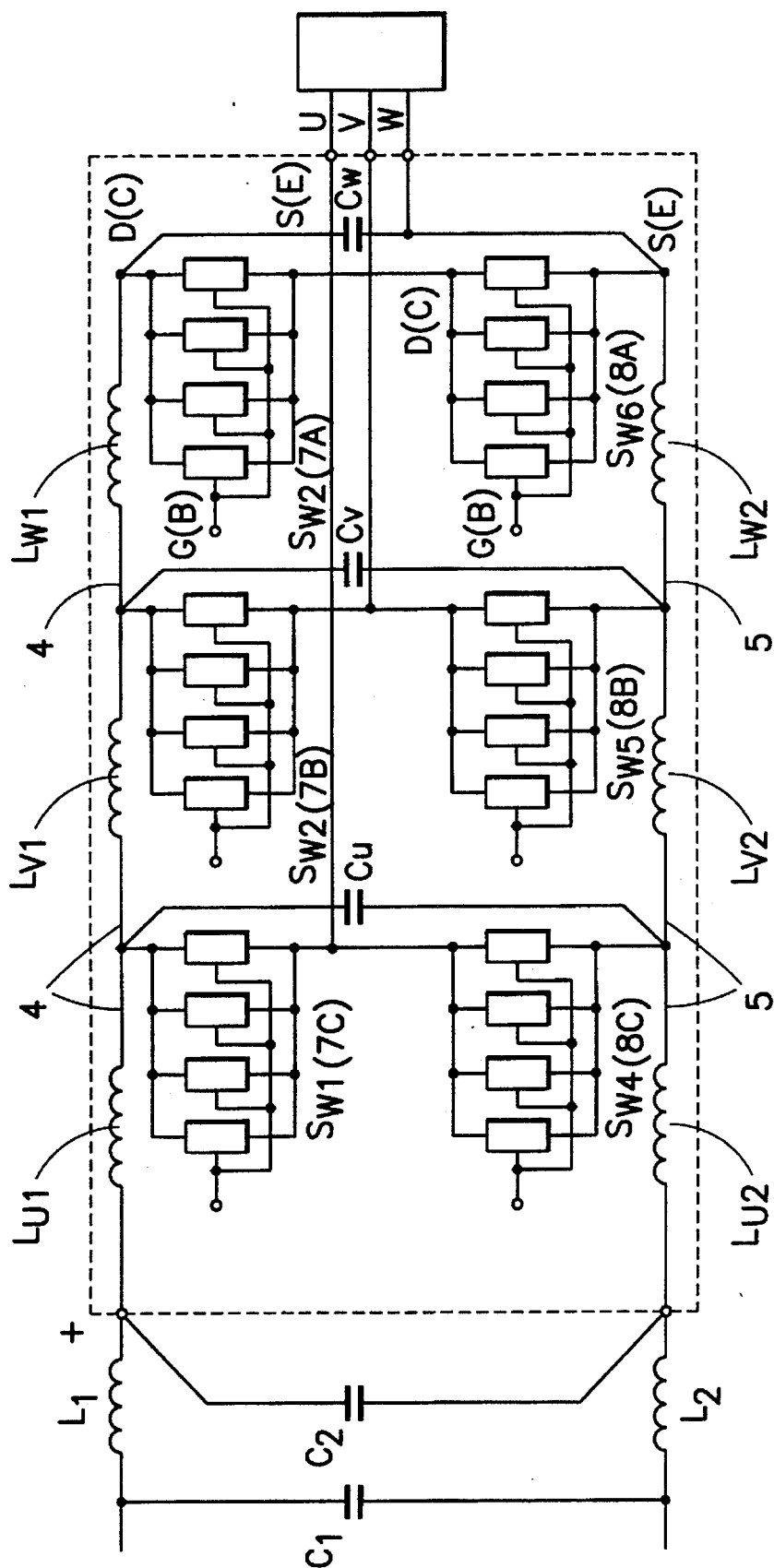
FIG. 8 is a schematic diagram of a prior-art inverter circuit suitable for use with the hybrid integrated circuit of the present invention.
Figure 10:
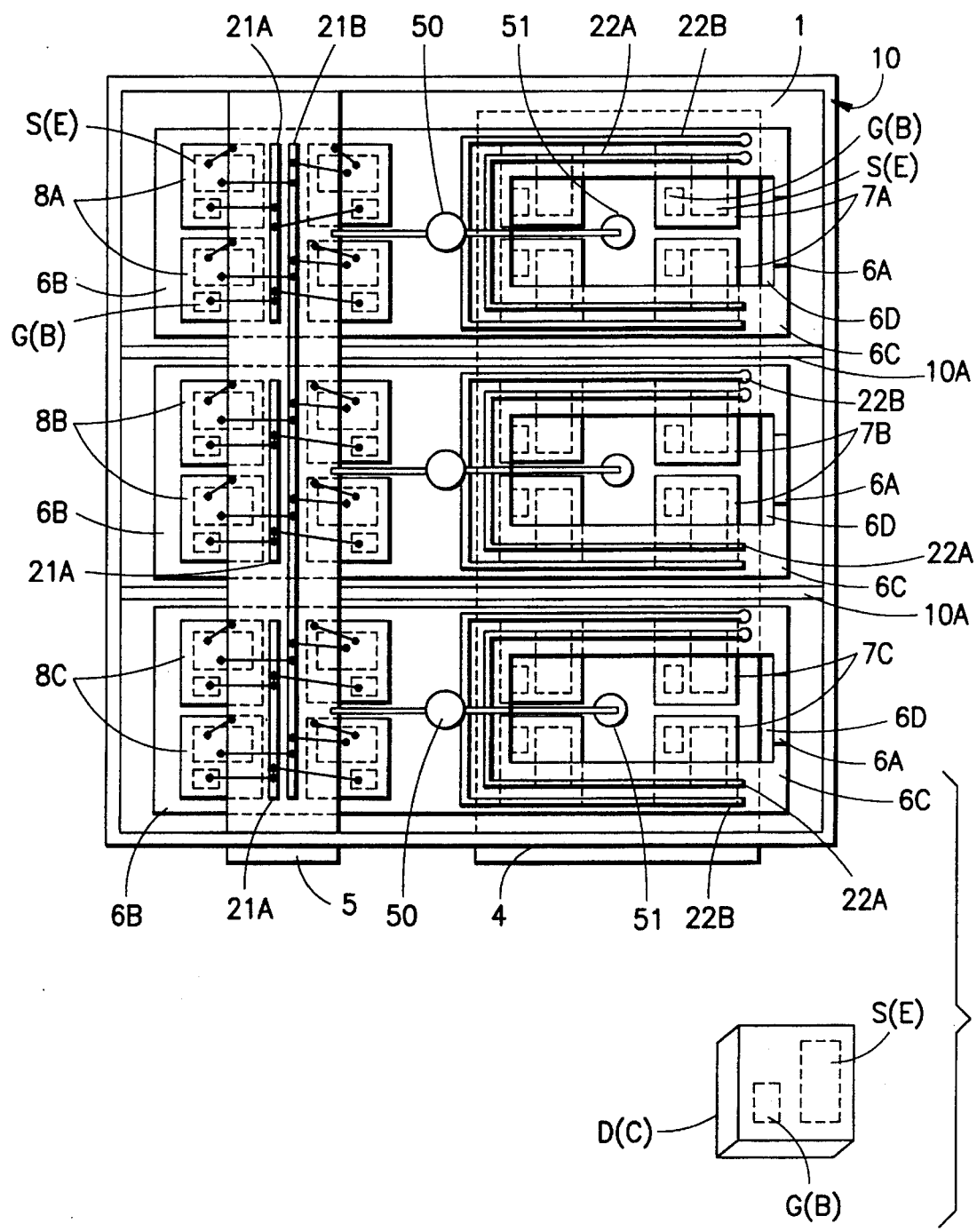
FIG. 10 is a plan view of a hybrid integrated circuit according to a third embodiment of the invention.
Figure 11:
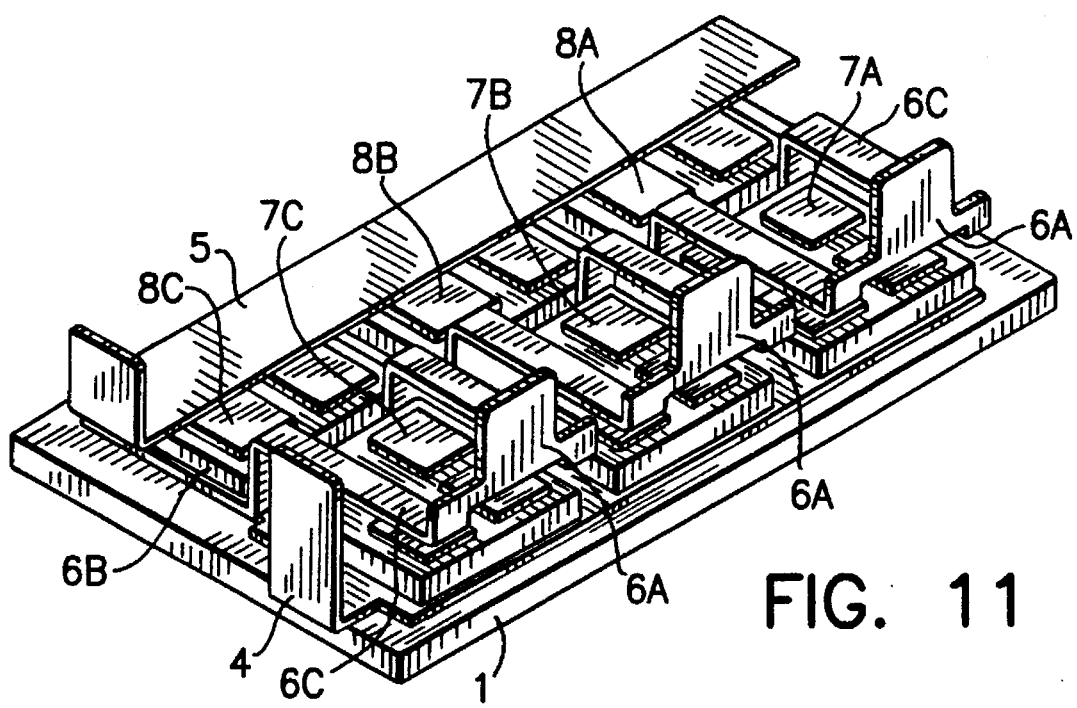
FIG. 11 is a perspective view of the hybrid integrated circuit of FIG. 10.

Referring now to FIGS. 5–7, the second embodiment of the invention is identical to the embodiment of FIGS. 2–4, save for the disposition and shape of first and second copper plates 4 and 5. As in the previous embodiment, first copper plate 4 is affixed to thick conductor path 3A by soldering layer 9. Copper plate 4 is of sufficient length to allow a small protrusion 4A to extend beyond the periphery of case 10. If desired, protrusion 4A can be bent flush against the casing and screwed directly into case 10 as shown in FIGS. 6b and 6c.

Second copper plate 5 is supported 2–5 mm above third copper plate 6 by bars 10A (FIG. 5) of case 10. Second copper plate 5 is oriented to overlap third copper plate 6 in the vertical plane. Second copper plate 5 is also of sufficient length to allow a small protrusion 5A to extend beyond the periphery of case 10. As in the case of protrusion 4A, small protrusion 5A can be screwed directly to case 10.

The disposition of second copper plate 5 out of the plane defined by first and third copper plates 4 and 6 allows for a compact circuit design, thus minimizing both the overall size of the circuit and the amount of wire used to connect the switching elements. Wire resistance and inductance are minimized, significantly reducing switching noise and voltage spikes.

Referring now to FIGS. 8–11, the third embodiment of the invention is similar to the embodiment of FIGS. 5–7 in that substrate 1, insulating layer 2 and conductive path 3 are formed in the manner described previously. First copper plate 4 and third copper plate 6 are connected to conductive path 3 by solder layer 9. Second copper plate 5 is supported 2–5 mm above, and partially overlapping, third copper plate 6 by bars 10A of case 10.

Protrusions 4A and 5A extend beyond the periphery of case 10, while protrusion 6A, which is substantially perpendicular to third copper plate 6, extends beyond the top of the completed device. A first power supply line, (not shown) is connected to protrusion 4A. A second power supply line (not shown) is connected to protrusion 5A. An output supply line (not shown) is connected to protrusion 6A. Each copper plate 4–6 and respective protrusion 4A, 5A and 6A is 1–5 mm thick to handle currents of 50–300 A.

Third copper plate 6 is bent to form a fixed surface 6B and an overlapping surface 6C. Fixed surface 6B, which is connected to conductive path 3A by solder layer 9, supports switching elements 8A, 8B, and 8C. Overlapping surface 6C, the center of which is removed to form an opening 6D, extends to overlap first copper plate 4. A top of overlapping surface 6C and a facing surface of first copper plate 4 are separated by approximately 2–5 mm.

High-side switching elements 7A, 7B and 7C are mounted on first copper plate 4 by solder layer 11. Low-side switching elements 8A, 8B and 8C are mounted on fixed surface 6B. Overlapping surface 6C and opening 6D are oriented with respect to the source/emitter portions of switching elements 7A, 7B and 7C to allow for symmetrical connection therebetween with uniform lengths of wire.

A control pattern 21 of copper membrane is fixed to second copper plate 5 by an epoxy resin-based insulating layer 23. Control pattern 21 consists of a combination of a short pathways 21A for each set of switching elements 8A, 8B and 8C, as well as a long pathway 21B extending along the internal length of second copper plate 5. The gate/base portions of switching elements 8A, 8B and 8C are connected to short pathways 21A by A1 wire having a diameter of 200–500 micrometers. The source/emitter portions are similarly connected to long pathway 21b.

Similarly, a control pattern 22 of copper membrane is affixed on overlapping surface 6C by an epoxy resin-based insulating layer 24. Control pattern 22 consists of two C-shaped pathways 22A and 22B disposed about opening 6D. A1 wire having a diameter of 200–500 micrometers connects the gate/base portions of switching elements 7A, 7B and 7C to pathways 22A of control pattern 22, while the source/emitter portions are connected to pathway 22B.

Since the second and third copper plates are oriented symmetrically to switching elements 8A, 8B and 8C and 7A, 7B and 7C, respectively, wires bonding the electrodes to the control patterns are roughly uniform, and of minimal length. A balanced current is therefore supplied to all parallel switching elements with minimal current loss and wire inductance.

Figure 12:
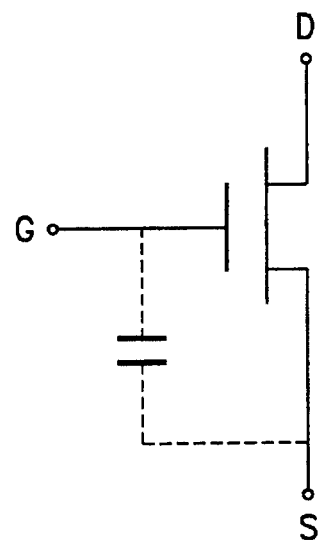
FIG. 12 is a schematic of a parasitic capacitance created in the third embodiment of the invention.
Figure 13:
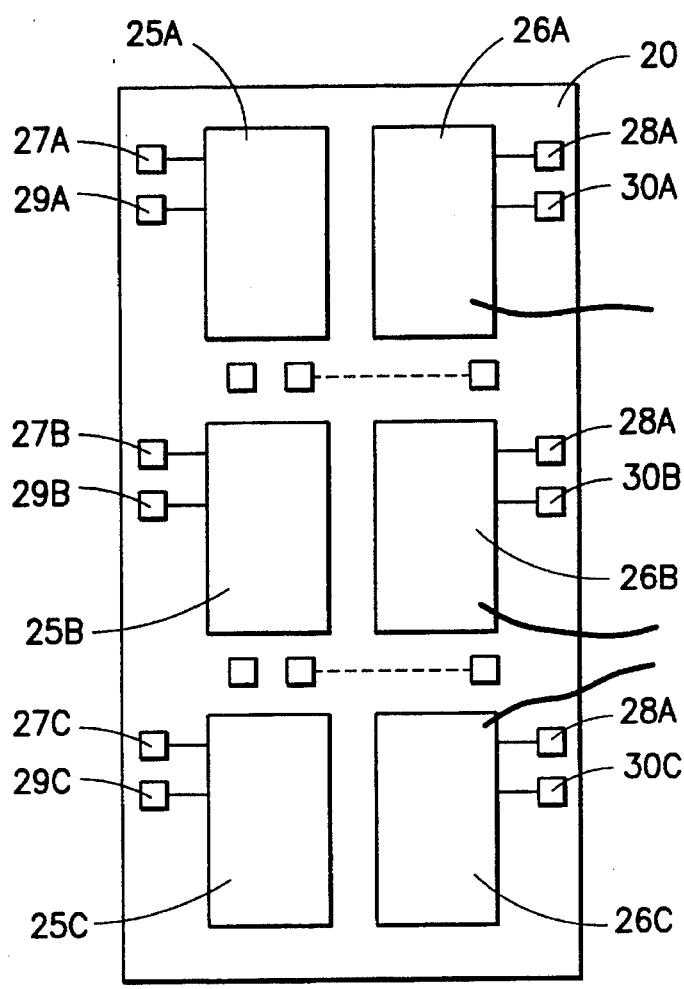
FIG. 13 is a plan view of a control substrate and associated drive elements used to drive the third embodiment of the invention.

A prescribed parasitic capacitance is formed between second and third copper plates 5 and 6, and first and second control patterns 21 and 22, respectively. For example, referring now to FIG. 12, the circuit forms a parasitic capacitance between the gate and source portion of a MOS type switching element which helps eliminate noise without requiring an independent noise-eliminating capacitor.

Returning now to FIGS. 8–11, the entire circuit is enclosed in case 10, which includes bars 10A to support both second copper plate 5 and a plurality of snubber capacitors 50 (Cu, Cv and Cw in FIG. 8) which eliminate self-inductance in the copper plates. For example, as discussed previously, if switching elements SW1 (7C) and SW5 (8B) are in the ON state, then resultant current path suffers inductances $L_{U1}$, $L_{U2}$, and $L_{V2}$. In the present invention, snubbing capacitor 50 (Cu) offsets inductances $L_{U1}$ and $L_{U2}$, substantially reducing noise and voltage spikes.

Snubbing capacitor 50 is a pre-fabricated device with two lead terminals. The first terminal is soldered to a metallic supporting column 51 screwed into first copper plate 4. The other lead terminal is soldered directly to second copper plate 5. Although the preferred embodiment of the invention uses a snubbing capacitor 50 having lead terminals, it may be surface mounted, or mounted directly onto third copper plate 6.

A control substrate 20, composed of an epoxy ceramic or metallic base substrate, is supported by bars 10B of case 10. Control substrate 20 has conductive patterns (not shown) on one or both of its sides. Drive circuits 25A, 25B and 25C and 26A, 26B and 26C, composed of circuit elements for driving switching elements 7A, 7B, 7C, 8A, 8B and 8C, are mounted on conductive substrate 20. Various other conventional circuits (not shown) such as for example, a temperature compensation circuit and a current detection circuit, are also mounted on control substrate 20. Connectors 31 are fixed at predetermined positions to connect control substrate 20 to external elements.

Drive circuits 25A, 25B, 25C, 26A, 26B, and 26C have pads 27A, 27B, 27C, 28A, 28B, and 28C, respectively, for connection to the gate/base portion of the switching elements. Similarly, pads 29A, 29B and 29C and 30A, 30B, and 30C connect to the source/emitter portions of the switching elements. Physical connection is achieved by bonding aluminum wire between the pads and the corresponding control pattern 21A, 21B, 22A, or 22B.

Once the circuit elements are bonded to form the desired circuit, the space enclosed by case 10 is filled sequentially with silicon gel 40 and epoxy resin 41 to protect the inner elements of the circuit. Although the wires are of uniform length, sufficient slack is provided to allow for expansion of silicon gel 40.

Figure 14:
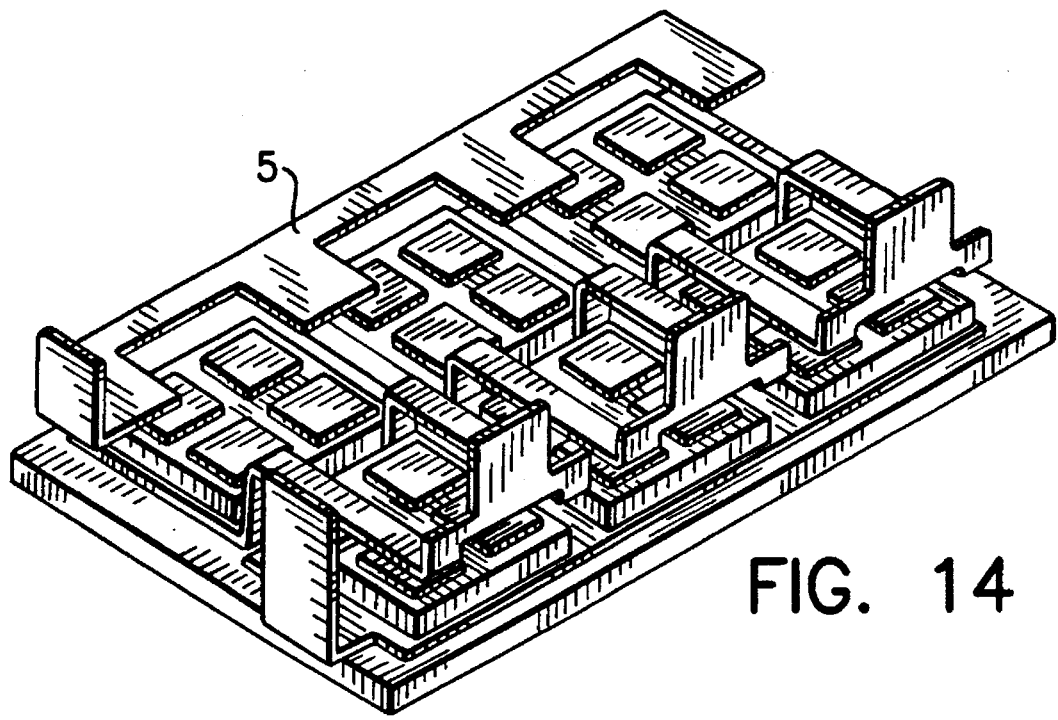
FIG. 14 is a perspective view of a fourth embodiment of the invention.

Referring now to FIG. 14, the fourth embodiment of the invention is similar to the embodiment of FIGS. 8–11 save for the disposition of second copper plate 5. Second copper plate 5 is embedded directly into case 10 to prevent deflection in the plate when bonded with wire.

Although the first, second and third plates of the foregoing embodiments are made from copper, the invention is not so limited. Any metal having a low resistivity and a high heat conductivity can be used.

Having described the preferred embodiments of the invention with reference to the accompanying drawings, it is to be understood that the invention is not limited to those precise embodiments, and that various changes and modifications may be effected therein by one skilled in the an without departing from the scope or spirit of the invention as defined in the appended claims.

What is claimed is:

1. A hybrid integrated circuit comprising:

a metallic substrate:

first and second metal plates;

said first metal plate being mounted on said metallic substrate;

said second metal plate shaped substantially as a step and having an upper step portion and a lower step portion;

said lower step portion being mounted on said metallic substrate;

said upper step portion of said second metal plate disposed above a portion of said first metal plate.

said upper step portion having an opening above a part of said portion of said first metal plate;

said upper step portion of said second metal plate having a control pattern thereon;

said first metal plate having means for mounting a switching element;

said switching element being arranged on said part of said portion of said first metal plate below said opening such that a plurality of connections between said switching element and said control pattern are of equal length, through said opening;

means for encasing said metallic substrate, said plurality of switching elements, said first and said second metal plates, and said plurality of connections;

said first and said second metal plates each including an end extending said first and said second metal plates beyond said means for encasing.

2. A hybrid integrated circuit comprising:

a metallic substrate;

first, second, and third metal plates;

said first metal plate being mounted on said metallic substrate;

said second metal plate shaped substantially as a step and having an upper step portion and a lower step portion;

said lower step portion being mounted on said metallic substrate;

said upper step portion of said second metal plate above said first metal plate and having an opening above said first metal plate;

said upper step portion of said second metal plate having a first control pattern thereon;

said first metal plate having means for mounting a first switching element;

said first switching element being arranged on said first metal plate below said opening;

said third metal plate above a part of said lower step portion of said second metal plate;

said third metal plate having a second control pattern thereon;

said lower step portion of said second metal plate having means for mounting a second switching element;

said second switching element being arranged on said lower step portion such that a plurality of connections made between said second switching element and said second control patten of said third metal plate are of equal length;

means for encasing said metallic substrate, said first and second switching elements, said first, said second and said third metal plates, and said connections;

said first, second and third metal plates including first, second and third protrusions, respectively; and said first, second and third protrusions extending beyond said means for encasing.

3. A hybrid integrated circuit according to claim 2, wherein:

said first metal plate and said lower step portion of said second metal plate are in a same plane; and at least one of said first, second, and third protrusions are substantially perpendicular to said plane.

4. A hybrid integrated circuit comprising:

a metallic substrate;

first, second and third copper plates said first copper plate and at least a portion of said second copper plate being mounted on said metallic substrate and defining a plane;

said third copper plate being disposed above said plane by a predetermined distance and overlaps said second copper plate;

a source-side switching element disposed on said first copper plate;

a sink-side switching element disposed on said portion of said second copper plate being mounted on said metallic substrate;

means for connecting said source-side switching element, said sink-side switching element and said first, second and third copper plates in a predetermined pattern;

means for encasing said metallic substrate, said source-side switching element, said sink-side switching element, said first, second and third copper plates, and said means for connecting;

said first and said third copper plates including first and third protrusions, respectively, which extend beyond a periphery of said means for encasing;

said second copper plate including a second protrusion substantially perpendicular to said plane and extending beyond a top surface of said means for encasing; and each of said first, second and third protrusions including means for connecting the respective protrusion to external circuits;

said second copper plate having an overlapping surface which is not part of said portion of said second copper plate being mounted on said substrate;

said overlapping surface being disposed above said first copper plate;

said overlapping surface having an opening through which portions of said source-side switching element are exposed;

a first control pattern disposed on said overlapping surface around said opening;

said means for connecting including means for uniformly connecting said source-side switching element to said control pattern;

a second control pattern disposed on said third copper plate; and said means for connecting including means for linking said sink-side switching element to said second control pattern.

5. A hybrid integrated circuit according to claim 4, further comprising a capacitor connected between said first and second metal plates.

* * * * *